United States Patent [19]

Maeda

[11] Patent Number: 5,101,261
[45] Date of Patent: Mar. 31, 1992

[54] ELECTRONIC CIRCUIT DEVICE WITH ELECTRONOMIGRATION-RESISTANT METAL CONDUCTORS

[75] Inventor: Takayuki Maeda, Ibaragi, Japan

[73] Assignee: Texas Instruments Incorporated, Dallas, Tex.

[21] Appl. No.: 614,563

[22] Filed: Nov. 14, 1990

Related U.S. Application Data

[63] Continuation of Ser. No. 399,205, Aug. 28, 1989, abandoned.

[30] Foreign Application Priority Data

Sep. 9, 1988 [JP] Japan .................. 63-227228

[51] Int. Cl.⁵ .................. H01L 21/92; H01L 23/54
[52] U.S. Cl. .................. 357/68; 357/85; 437/957
[58] Field of Search .................. 357/71, 68, 67, 51

[56] References Cited

U.S. PATENT DOCUMENTS

| | | | |
|---|---|---|---|
| 3,629,782 | 12/1971 | Sahni | 357/51 |
| 3,717,564 | 2/1973 | Bhatt | 357/71 |
| 4,017,890 | 4/1977 | Howard et al. | 357/71 |
| 4,812,419 | 3/1989 | Lee et al. | 357/67 |
| 4,847,673 | 7/1989 | Matsukawa | 357/68 |
| 4,870,472 | 9/1989 | Vyne | 357/68 |
| 4,907,066 | 3/1990 | Thomas et al. | 357/65 |
| 4,922,320 | 5/1990 | McDavid et al. | 357/67 |
| 4,924,295 | 5/1990 | Küecher | 357/67 |
| 4,926,237 | 5/1990 | Sun et al. | 357/67 |
| 4,937,652 | 6/1990 | Okumura et al. | 357/67 |

FOREIGN PATENT DOCUMENTS

| | | | |
|---|---|---|---|
| 0130591 | 1/1985 | European Pat. Off. | |
| 0072349 | 5/1982 | Japan. | |
| 59-110135 | 6/1984 | Japan. | |
| 0059774 | 4/1985 | Japan. | |
| 60-227444 | 11/1985 | Japan | 357/68 |
| 0225837 | 10/1986 | Japan | 357/68 |
| 61-283154 | 12/1986 | Japan. | |
| 0010542 | 1/1988 | Japan. | |

*Primary Examiner*—Andrew J. James
*Assistant Examiner*—Viet Q. Nguyen
*Attorney, Agent, or Firm*—William E. Hiller; N. Rhys Merrett; Melvin Sharp

[57] ABSTRACT

An electronic circuit device wherein lines are provided to connect elements, and wherein a plurality of island shaped non-line parts, which do not have the function of the lines, are formed along the length of the lines.

8 Claims, 4 Drawing Sheets

ELECTRONIC CIRCUIT DEVICE WITH ELECTRONOMIGRATION-RESISTANT METAL CONDUCTORS

This application is a continuation of application Ser. No. 399,205, filed Aug. 28, 1989 now abandoned.

BACKGROUND OF THE INVENTION

1. Field of the Invention

This invention relates to electronic circuit devices.

2. Description of the Prior Art

Conventionally, electronic circuit devices are generally constituted with lines which connect elements such as transistors, capacitors, resistors, power supplies or the like, and Al or the like is used for the material of the lines.

When a large current flows through lines of Al or the like, the kinetic energy of the electrons is transferred to atoms or particles by collision of the electrons with the atoms or the particles, so a phenomenon generally called electromigration is said to occur in which the atoms or the particles move gradually with the flow of the electrons.

Therefore, the electromigration becomes apparent as current density in the lines increases. Especially if the movement of the atoms or the particles is not uniform (e.g., if there is a crystal grain boundary), the atoms or the particles decrease in some parts, and the parts of the lines would become small. In this case, more parts in the line become small, and the electric resistance in the lines as a whole would become high. In the worst case, the lines will be disconnected. Also, in the parts where the atoms or the particles gather, so called hillocks are liable to be formed, which is regarded to be a serious problem (i.e., a short circuit between the lines caused by the hillocks) especially in multilayer interconnection structure.

Because the life time of the lines with electromigration is regarded to be inversely proportional to the squar-cube of the current density, shrinkage of a line's sectional area by reduction in device size and increase in the current density thereby significantly decreases the life time of the lines.

SUMMARY OF THE INVENTION

A purpose of the invention is to provide a highly reliable electronic circuit device which can effectively control electromigration (i.e., having high resistance to the electromigration), without increasing electric resistance of lines as a whole.

This invention relates to such electronic circuit device wherein lines are provided to connect elements, and wherein a plurality of island shaped non-line parts, which do not have the function of the lines, are formed along the length of said lines. The above "plurality" means that the above non-line parts exist respectively in a first area and a second area along the length of the lines (there being, however, one or two, or even more non-line parts in each area).

BRIEF BESCRIPTION OF THE DRAWINGS

FIG. 1 is an enlarged plan view of a main part of the lines of a first embodiment.

FIG. 2 is a sectional view of FIG. 1 taken along the line II—II;

FIG. 3 is a plan view showing a part of a logic VLSI circuit;

FIG. 4 is a graph showing mean time between failure (life time) of the lines to the ratio of the line width and grain size.

FIG. 5 is a graph showing the ratio of the resistance change to the testing time, when a stress text is conducted;

FIG. 6 is an enlarged plan view of a main part of a line of another embodiment;

Figure 2:
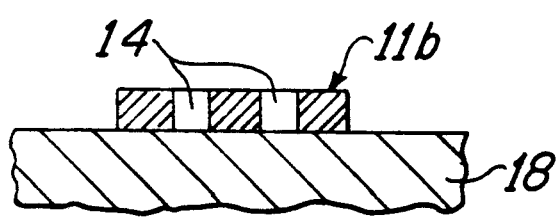
Figure 7A:
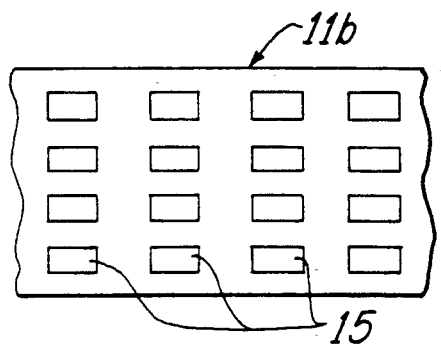
Figure 7B:
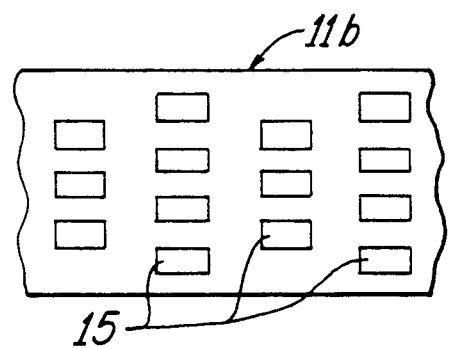
Figure 7C:
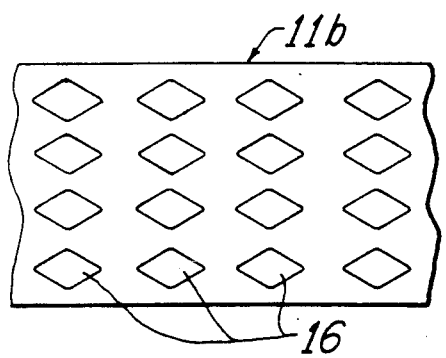
Figure 7D:
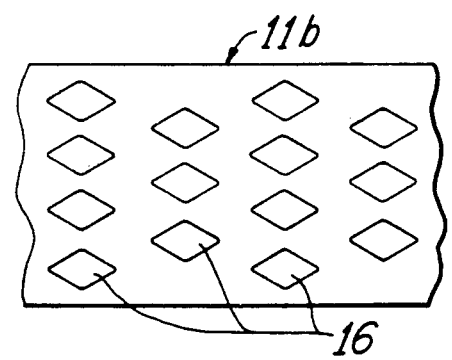
Figure 7E:
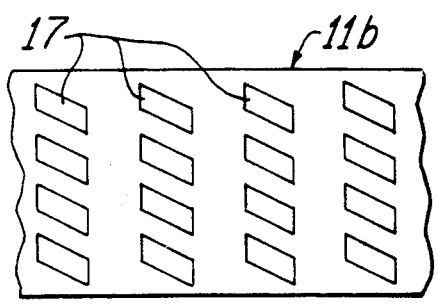
Figure 8:
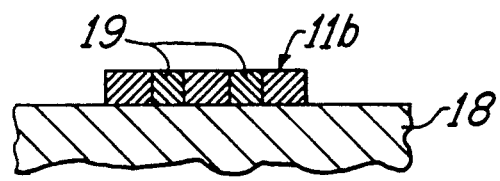

FIGS. 7(a), (b), (c), (d), and (e) are respective enlarged plan views of main parts of lines of other embodiments; and FIG. 8 is a sectional view of a line, similar to FIG. 2, of another embodiment.

DETAILED DESCRIPTION OF THE PREFERRED EMBODIMENTS

Hereinafter, the embodiments of the invention will be described.

FIGS. 1-5 show a first embodiment of this invention.

Figure 1:
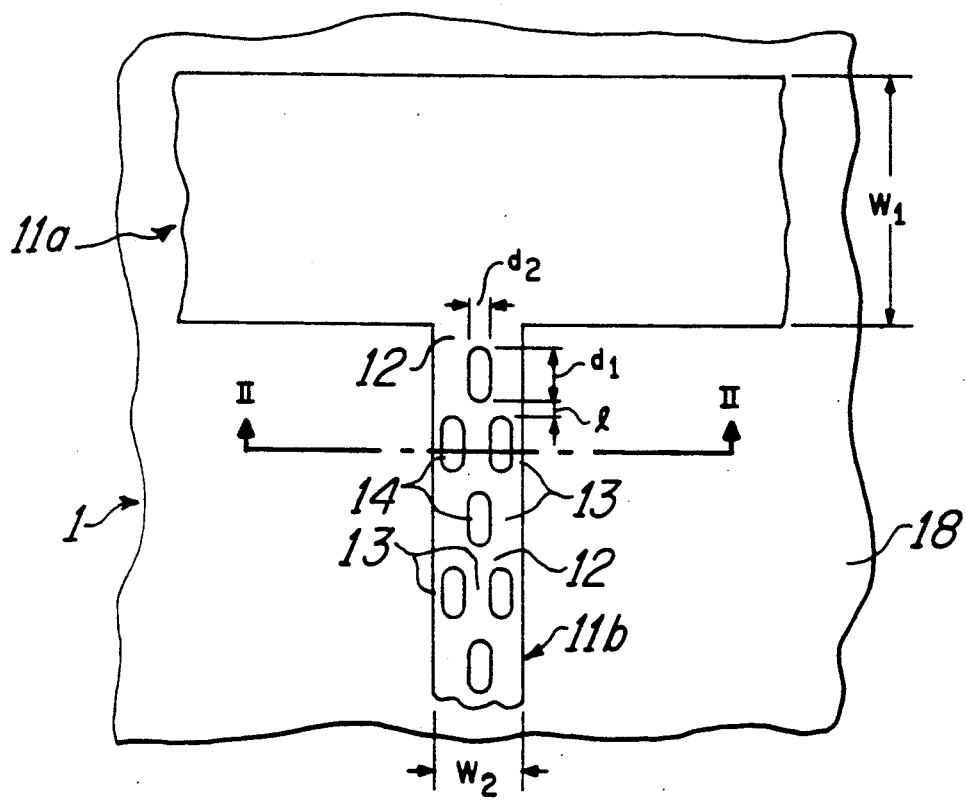
FIGS. 1-8 show embodiments of the invention.
Figure 3:
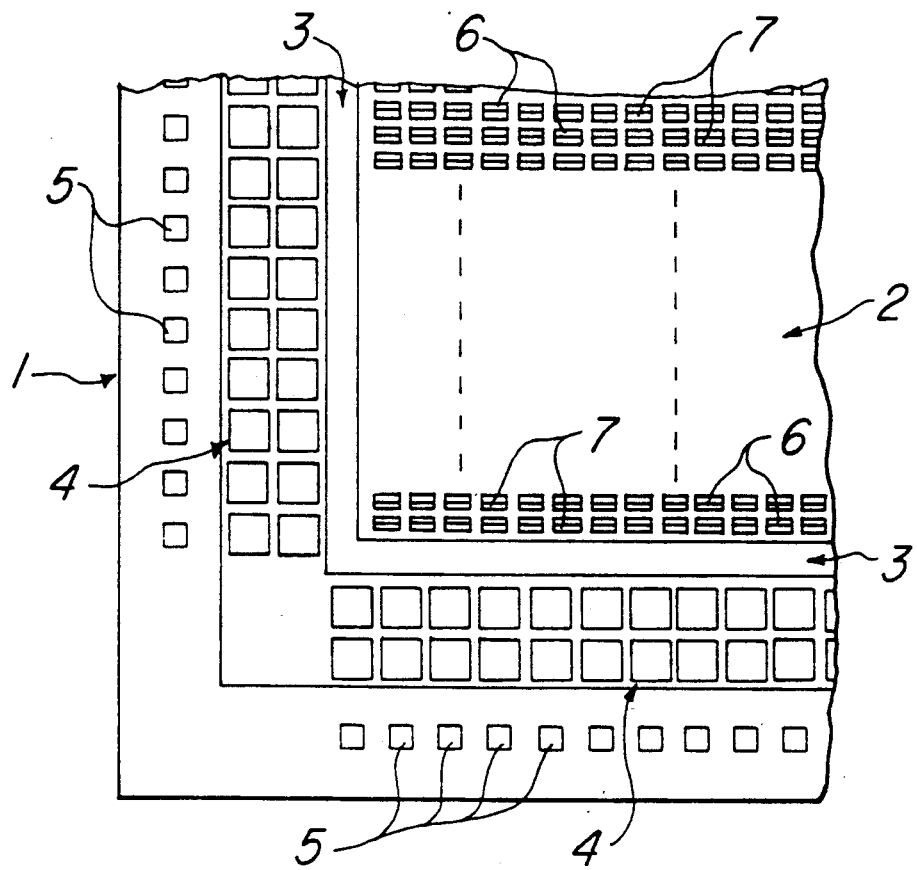

As seen in FIGS. 1 and 2, a wide line 11a (which may be, for example, one existing in a line area 3 in FIG. 3, which will be described later, such as a power supply line or the like with a line width $w_1$ of 50 um) is provided on an insulation layer 18 of an IC chip 1, and a small line 11b (which may be a line from the power supply line in the above line region 3 of FIG. 3 to, for example, an internal logic 2 in the same figure) with a width $w_2$ of, for example, 6 um, branches from the line 11a. These lines 11a and 11b may be formed, for example, by stacking an Al-Si (1%) layer on a TiW layer. Furthermore, a plurality of ellipse shaped small holes 14 (which, being one or two at an area, are spaced with equal distance 1, for example, 2 um, along the length of the line 11b, and are also placed to equally divide the width of the line, for example, to have a distance of 2.5 um at both sides of a hole in the area where there is one small hole 14) with a length $d_1$ of 2.0 um and a width $d_2$ of 1.0 mu are formed along the length of the small line 11b. In FIG. 1, the small holes are formed in five areas (there are actually more, although not shown). That is, from the side close to the line 11a, there is one hole in the first area, 2 in the second, 1 in the third, 2 in the fourth, and 1 in the fifth, along the length of the line. Because the line 11a is wide, such as of 50 um, it has sufficient current capacity and need not have small holes 14 or the like to be formed.

As described above, according to the electronic circuit device of the embodiment, current is diverted in a complicated manner to flow through the line 11b, because a plurality of the ellipse shaped small holes 14 are formed along the length of this line. Therefore, the amount of kinetic energy, which electrons give to Al atoms or the like in the line 11b, substantially decreases without being collected in some areas, and the movement of the Al atoms or the like would become difficult because of the above small holes, so that the electromigration may be prevented.

On the other hand, the electromigration in the Al lines, for example, which is generally used in electronic circuits, is found to abruptly be controlled not to cause disconnection of the lines, when the line width becomes less than 2-3 um, so that the life time of the lines will be longer. That is, compared to the case in which current is applied with a predetermined density to an Al line, for example, with a grain size (crystal grain diameter) of 2.0 um and a width of 5.5 um, the life time of a line is much longer than in the case in which current is applied with the same density to a line with a width of 2.5 um.

Figure 4:
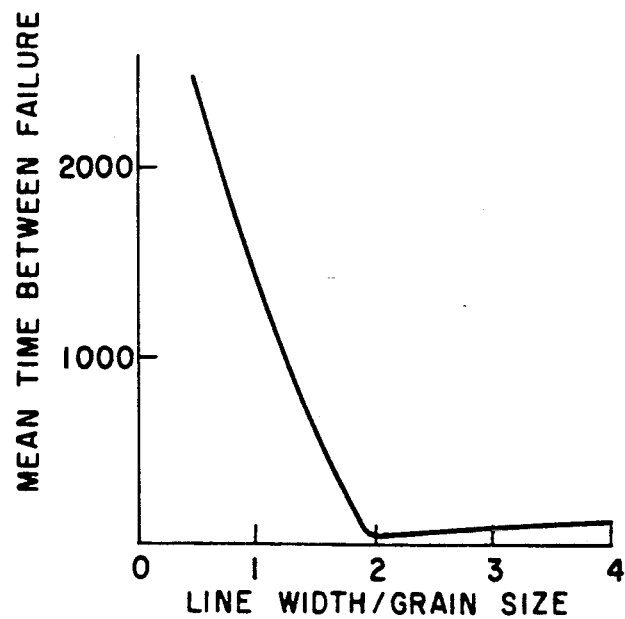
Figure 5:
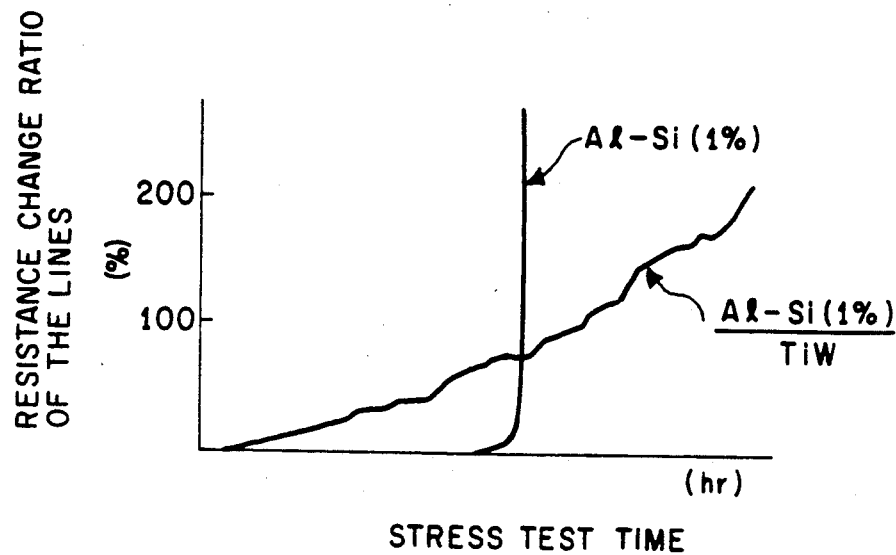

The above will be described with regard to FIG. 4 (in this case, the lines being two-layer structure in which Al-Si lines are formed on a TiW layer). This figure shows the time taken for the lines to begin to malfunction (the mean time between failure), when the current with a density of $2 \times 10^6$ A/cm$^2$ is applied to the lines. That is, as seen in the figure, the mean time between failure (the life time of the lines) can be seen to be much longer, when a line width is determined by the grain size of the line material, and especially when the line width is less than twice as much as the grain size. FIG. 5 shows the resistance change of the lines when a stress test is conducted with the current of similar density to that of FIG. 4 ($2 \times 10^6$ A/cm$^2$) being applied to the lines, and the resistance change of the above two-layer structure lines is gentler than the single Al-Si layer lines, under the current density which is larger by an order of magnitude than the one in the normal operation ($1 \times 10^5$ A/cm$^2$).

As evident from the above, because a plurality of small holes 14 are formed along the length of the line 11b in the embodiment of FIG. 1, the practical line width is less than 2.5 um and is close to the grain size (2.0 um). Therefore, the movement of the Al atoms or the like becomes difficult or impossible, which is also facilitated by the small holes 14, so the movement of the Al atoms or the like may be practically controlled. In other words, in small parts of the line 13, the line width/grain size shown in FIG. 4 is less than 1.25, so the mean time between failure is significantly longer. As a result, the electromigration may be controlled. Moreover, because the small holes 14 are minute and a plurality of them are formed only in the predetermined areas of the line as described above, the electric resistance in the lines as a whole does not increase so much.

The above line width, size of the small holes, and the pattern may appropriately be determined by a mask pattern of a well known etching. Also, the above grain size may be controlled by selecting conditions of a thermal treatment of the etching.

FIG. 3 is a schematic layout of a part of a logic VLSI (Very Large Scale Integrated) circuit, and reference numeral 1 in the figure is a chip, 2 is internal logic, for example, of a CMOS type, 3 is a line region (a power supply, a ground line, or the like not being shown in the figure), 4 is peripheral circuit parts, 5 is bonding pads, 6 is P channel CMOS channel transistors, and 7 is N channel MOS transistors.

Figure 6:
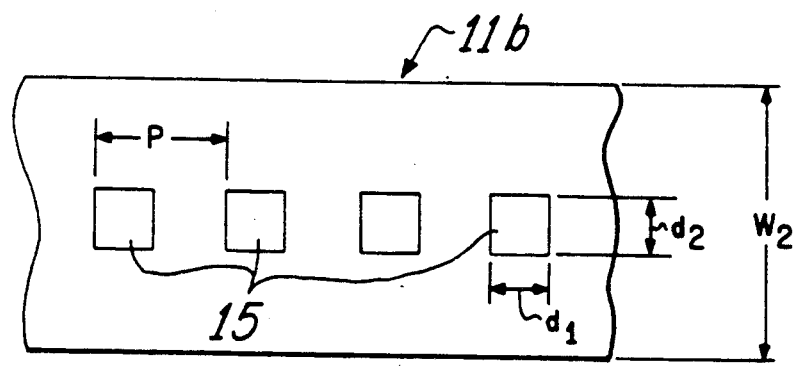

FIG. 6 shows another embodiment of the invention. That is, as the same as the above described first embodiment, a plurality of rectangle shaped small holes 15 with the length d$_1$ of 1.0 um and the width d$_2$ of 2.0 um are formed along the length of the line 11b (the width w$_2$ being about 6.0 um) with a pitch of 4.0 um.

Therefore, the same advantages as of the first embodiment may be achieved because of the similar reason to the above, although the placement of the small holes 15 are relatively simple in this embodiment.

FIG. 7(a)-(e) show other embodiments in which shapes and numbers of the small holes are varied compared to the above embodiment, such as 15 holes in (a) and (b), 16 in (c) and (d), and 17 in (e). These embodiments also have the above advantages.

Although the invention has been illustrated in the above, the above embodiments may be further modified based on the idea of the invention.

For example, the shapes, numbers, and locations of the above small holes may appropriately be changed, and various etching methods may be utilized in their fabrication. Materials of the lines may be metals of a high melting point such as tungsten, molybdenum or the like, and the other appropriate materials besides aluminum. This invention may be applied also to regular connection lines (also effective when a relatively wide line and a relatively small line are connected) besides the power supply lines in the above.

As in FIG. 8, predetermined island shaped insulation region 19, not the small holes as in the above, may also be formed in the predetermined regions of the lines (i.e., in the same region as the small holes 14). The regions 19 function as the same as the small holes 14.

The invention may also be applied to memories or the like of dynamic RAMs or the like, besides the above logic circuits.

ACTION/EFFECT OF THE INVENTION

As described above, this invention can provide a highly reliable electronic circuit device wherein current flows diversely, and the movement of elements comprised in lines is made difficult, because of a plurality of island shaped non-line parts, which do not have the function of the lines, formed along the length of a metal line, and wherein electromigration can effectively controlled thereby without increasing the electric resistance in the lines as a whole.

What is claimed is:

1. An electronic circuit device comprising:
   a substrate;
   at least a pair of circuit elements disposed on said substrate in spaced relation with respect to each other;
   an elongated electrically conductive metal line disposed on said substrate, said elongated electrically conductive metal line extending between and connecting said pair of circuit elements;
   said elongated electrically conductive metal line having a width of sufficiently small magnitude to ordinarily subject the metal atoms of said elongated electrically conductive metal line to electromigration when an electrical current above a threshold magnitude is flowing through said elongated electrically conductive metal line due to the transfer of kinetic energy from the moving electrons of the electrical current to metal atoms of said elongated electrically conductive metal line; and
   said elongated electrically conductive metal line having a plurality of small holes therein distributed along the length thereof and arranged in relation to the width of said elongated electrically conductive metal line for reducing the percentage of electrically conductive metal material included in the widthwise dimension of said elongated electrically conductive metal line due to the presence of the plurality of small holes therein to provide an effective width of said elongated electrically conductive metal line, when considering the presence of the plurality of small holes therein, approximating the grain size of the metal material of said elongated electrically conductive metal line for inducing electromigration resistance in said elongated electrically conductive metal line.

2. An electronic circuit device comprising:
   a substrate;

at least a pair of circuit elements disposed on said substrate in spaced relation with respect to each other;

an elongated electrically conductive metal line disposed on said substrate, said elongated electrically conductive metal line extending between and connecting said pair of circuit elements;

said elongated electrically conductive metal line having a width of sufficiently small magnitude to ordinarily subject the metal atoms of said elongated electrically conductive metal line to electromigration when an electrical current above a threshold magnitude is flowing through said elongated electrically conductive metal line due to the transfer of kinetic energy from the moving electrons of the electrical current to metal atoms of said elongated electrically conductive metal line; and a plurality of small individual regions of insulation material disposed in said elongated electrically conductive metal line and extending therethrough, said small individual regions of insulation material being distributed along the length of said elongated electrically conductive metal line and arranged in relation to the width thereof for reducing the percentage of electrically conductive metal material included in the widthwise dimension of said elongated electrically conductive metal line due to the presence of the plurality of small individual regions of insulation material therein to provide an effective width of said elongated electrically conductive metal line, when considering the presence of the plurality of small individual regions of insulation material therein, approximating the grain size of the metal material of said elongated electrically conductive metal line for inducing electromigration resistance in said elongated electrically conductive metal line.

3. An electronic circuit device as set forth in claim 2, wherein the effective width of said elongated electrically conductive metal line is less than 1.25 times as much as the grain size of the metal material of said elongated electrically conductive metal line.

4. An electronic circuit device as set forth in claim 1, wherein the effective width of said elongated electrically conductive metal line is less than 1.25 times as much as the grain size of the metal material of said elongated electrically conductive metal line.

5. An electronic circuit device as set forth in claim 1, wherein said plurality of small holes are of uniform size and of oval shape extending lengthwise in the length direction of said elongated electrically conductive metal line; and said oval-shaped holes being arranged along the length of said elongated electrically conductive metal line in an alternating lengthwise sequence of a single oval-shaped hole centrally disposed with respect to the opposite side margins of said elongated electrically conductive metal line and a pair of oval-shaped holes respectively spaced from the opposite side margins of said elongated electrically conductive metal line and respectively offset outwardly with respect to the centrally disposed single oval-shaped hole in opposite widthwise directions of said elongated electrically conductive metal line so as to be closer to the corresponding one of the opposite side margins of said elongated electrically conductive metal line than the centrally disposed single oval-shaped hole.

6. An electronic circuit device as set forth in claim 1, wherein said plurality of small holes are of rectangular shape.

7. An electronic circuit device as set forth in claim 1, wherein said plurality of small holes are of diamond shape.

8. An electronic circuit device as set forth in claim 1, wherein said plurality of small holes are shaped in the form of rhomboids.

* * * * *